(12) United States Patent
Barclay et al.

(10) Patent No.: US 7,211,365 B2
(45) Date of Patent: May 1, 2007

(54) NEGATIVE PHOTORESISTS FOR SHORT WAVELENGTH IMAGING

(75) Inventors: George G. Barclay, Jefferson, MA (US); Nicola Pugliano, Grafton, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 166 days.

(21) Appl. No.: 10/382,090

(22) Filed: Mar. 4, 2003

(65) Prior Publication Data

US 2003/0235785 A1 Dec. 25, 2003

Related U.S. Application Data

(60) Provisional application No. 60/361,547, filed on Mar. 4, 2002.

(51) Int. Cl.
*G03F 7/032* (2006.01)
*G03F 7/033* (2006.01)
*G03F 7/30* (2006.01)

(52) U.S. Cl. ............... 430/270.1; 430/325; 430/905; 430/907

(58) Field of Classification Search ........... 430/270.1, 430/325, 907, 905
See application file for complete search history.

(56) References Cited

U.S. PATENT DOCUMENTS

| | | | | |
|---|---|---|---|---|
| 3,725,356 A * | 4/1973 | Luders et al. | ............... | 526/262 |
| 4,968,586 A * | 11/1990 | DoMinh | ............... | 430/325 |
| 5,487,967 A | 1/1996 | Hutton et al. | ............... | 430/322 |
| 5,900,346 A * | 5/1999 | Sinta et al. | ............... | 430/270.1 |
| 6,027,856 A | 2/2000 | Nozaki et al. | ............... | 430/281.1 |
| 6,140,010 A * | 10/2000 | Iwasa et al. | ............... | 430/270.1 |
| 6,444,397 B2 | 9/2002 | Hada et al. | | |
| 6,469,197 B1 | 10/2002 | Maeda et al. | | |
| 6,503,686 B1 * | 1/2003 | Fryd et al. | ............... | 430/270.1 |
| 6,548,219 B2 * | 4/2003 | Ito et al. | ............... | 430/270.1 |
| 6,653,045 B2 * | 11/2003 | Angelopoulos et al. | .. | 430/270.1 |
| 6,764,809 B2 * | 7/2004 | DeSimone et al. | ......... | 430/313 |
| 6,790,587 B1 * | 9/2004 | Feiring et al. | ............ | 430/270.1 |
| 6,844,134 B2 * | 1/2005 | Choi et al. | ............... | 430/270.1 |
| 2001/0049073 A1 | 12/2001 | Hada et al. | | |
| 2002/0058199 A1 | 5/2002 | Zampini et al. | ......... | 430/270.1 |
| 2002/0081520 A1 * | 6/2002 | Sooriyakumaran et al. | ................. | 430/270.1 |
| 2002/0090572 A1 | 7/2002 | Sooriyakumaran et al. | | |
| 2002/0092894 A1 * | 7/2002 | Wang et al. | .......... | 228/180.22 |
| 2003/0129527 A1 | 7/2003 | Kudo et al. | | |
| 2004/0265754 A1 * | 12/2004 | Barclay et al. | ............ | 430/322 |

OTHER PUBLICATIONS

Conley et al., "Negative Photoresist for 157 nm Microlithography; A Progress Report", Proceedings of SPIE, vol. 4690, pp. 94-100 (2002).

* cited by examiner

*Primary Examiner*—Richard L. Schilling
(74) *Attorney, Agent, or Firm*—Peter F. Corless; Darryl P. Frickey; Edwards Angell Palmer & Dodge, LLP

(57) ABSTRACT

New negative-acting photoresist compositions are provided that are particularly useful for imaging at short wavelengths, particularly sub-200 nm wavelengths such as 193 nm. Resists of the invention provide contrast between exposed and unexposed coating layer regions through crosslinking or other solubility switching mechanism. Preferred resists of the invention include a resin component that contains repeat units that facilitate aqueous base solubility.

5 Claims, 2 Drawing Sheets

NEGATIVE PHOTORESISTS FOR SHORT WAVELENGTH IMAGING

The present application claims the benefit of U.S. provisional application No. 60/361,547 filed Mar. 4, 2002, which is incorporated herein by reference in its entirety.

BACKGROUND OF THE INVENTION

1. Field of the Invention

The present invention relates to new negative-acting photoresist compositions that are particularly useful for imaging at short wavelengths, particularly sub-200 nm wavelengths such as 193 nm. Resists of the invention provide contrast between exposed and unexposed coating layer regions through crosslinking or other solubility switching mechanism. Preferred resists of the invention include a resin component that contains repeat units that facilitate aqueous base solubility.

2. Background

Photoresists are photosensitive films used for transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist-coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable reagents of the photoresist composition. Consequently, the exposed coating portions are rendered less soluble in a developer solution than unexposed portions. For a positive-acting photoresist, exposed portions are rendered more soluble in a developer solution while areas not exposed remain comparatively less developer soluble. Photoresist compositions are described in Deforest, Photoresist Materials and Processes, McGraw Hill Book Company, New York, ch. 2, 1975 and by Moreau, Semiconductor Lithography, Principles, Practices and Materials, Plenum Press, New York, ch. 2 and 4.

While currently available photoresists are suitable for many applications, current resists also can exhibit significant shortcomings, particularly in high performance applications such as formation of highly resolved sub-half micron and sub-quarter micron features.

Consequently, interest has increased in photoresists that can be photoimaged with short wavelength radiation, including exposure radiation of about 250 nm or less, or even about 200 nm or less, such as wavelengths of about 248 nm (provided by KrF laser) or 193 nm (provided by an ArF exposure tool). See European Published Application EP915382A2. Use of such short exposure wavelengths can enable formation of smaller features. Accordingly, a photoresist that yields well-resolved images upon 248 nm or 193 nm exposure could enable formation of extremely small (e.g. sub-0.25 µm) features that respond to constant industry demands for smaller dimension circuit patterns, e.g. to provide greater circuit density and enhanced device performance.

More specifically, current photoresists can be highly opaque to extremely short exposure wavelengths such as 193 nm, thereby resulting in poorly resolved images.

Most efforts to date for imaging at 193 nm have been directed positive-acting resists. Certain reports have been made of negative resists for imaging at 193 nm. See U.S. Pat. Nos. 6,146,806; 6,140,010; and 6,103,449.

It thus would be desirable to have new photoresist compositions, particularly resist compositions that can be imaged at short wavelengths such as sub-200 nm exposure wavelengths, particularly 193 nm. It would be particularly desirable to have new negative-acting resists that could be imaged at sub-200 nm wavelengths, such as 193 nm.

SUMMARY OF THE INVENTION

We now provide new negative-acting photoresist compositions that can be effectively imaged with sub-200 nm wavelength radiation, particularly 193 nm radiation.

Typical photoresists of the invention comprise a resin component and a photoactive component. Preferred photoactive components comprise one or more photoacid generator compounds. The resist also may comprise a separate crosslinker component, e.g. an epoxy or an amine-based material, although such a separate crosslinker component is not needed in many preferred systems.

More particularly, in a first aspect of the invention, photoresists are provided that contain a resin component that preferably can display both of two characteristics: 1) aqueous base solubility (i.e. aqueous base developer solubility); and 2) contrast between exposed and unexposed and exposed regions. Those characteristics are typically provided by distinct repeat units of the resist resin.

Preferred resins for use in resists of the invention will contain an aqueous base solubilizing group selected from 1) fluorinated alcohols, particularly fluorinated alcohols having 3 to about 8 carbons, with a pendant 1,1,1,3,3,3-hexafluoro-2-propanol (i.e. the radical of $(CF_3)_2C(OH)$—) being particularly preferred; 2) lactones such as γ-butyrolactone; 3) anhydrides such as maleic anhydride and itaconic anhydride; and 4) sulfonamides, including sulfonamides substituted with one or more electron-withdrawing groups such as halo, particularly fluoro, e.g. groups of the formula —$NHSO_2$-(fluoro$C_{1-8}$alkyl) such as —$NHSO_2$—$CF_3$.

The contrast characteristic of the resin can be provided by any one of several approaches. The contrast characteristic should make exposed regions of a resist coating layer less soluble to aqueous base developer than unexposed regions.

A preferred contrast approach is crosslinking. More particularly, one or more components of the resist formulation will harden, cure and/or form covalent linkages upon exposure to activating radiation such as sub-200 nm radiation. In one preferred system, the resin component contains groups such as hydroxy (particularly primary or secondary alcohol) or carboxy that can react with a separate crosslinker component of the resist, e.g. an epoxy or amine-based additive such as a melamine or benzaguanamine resin.

Another preferred contrast approach is a non-crosslinking "solubility switch" which renders exposed regions of a resist coating layer less soluble with respect to aqueous base developer relative to unexposed regions. One preferred solubility switch system comprises pendant secondary or tertiary alcohol groups that will eliminate (lose water to form carbon-carbon double bond) in the presence of photogenerated acid and if necessary post-exposure thermal treatment.

In a further aspect of the invention, negative-acting photoresists are provided that contain a resin component that comprises repeat units that comprise either or both of 1) a fluorinated alcohol, particularly a fluorinated alcohol having 3 to about 8 carbons, with a pendant 1,1,1,3,3,3-hexafluoro-2-propanol (i.e. the radical of $(CF_3)_2$—COH) being particularly preferred; and 2) a sulfonamide, including a sulfonamide substituted with one or more electron-withdrawing groups such as halo, particularly fluoro, e.g. groups of the formula —$NHSO_2$-(fluoor$C_{1-8}$alkyl) such as —$NHSO_2$—$CF_3$.

In a yet further aspect of the invention, negative-acting photoresists are provided that contain a resin component that comprises repeat units that comprise both of 1) a fluorinated alcohol, particularly a fluorinated alcohol having 3 to about 8 or 10 carbons, with a pendant 1,1,1,3,3,3-hexafluoro-2-propanol (i.e. the radical of $(CF_3)_2$—COH) being particularly preferred; and 2) a secondary or primary alcohol or carboxy, preferably a pendant primary alcohol or carboxy. Such resists preferably comprise a separate crosslinker component, e.g. an epoxy material or an amine-based material. In such systems, the crosslinker can react with the less sterically restricted secondary or primary carboxy or alcohol, and the fluorinated alcohol can serve as a dissolution enhancing group. Particularly preferred in such systems is use of a resin that comprises repeat units that contain 1,1,1,3,3,3-hexafluoro-2-propanol groups, and repeat units that contain a secondary or primary alcohol, preferably a primary alcohol.

We have found that resists of the invention preferably contain a limited hydroxy (e.g. alcohol, especially primary and secondary alcohol) content. For example, preferred resists contain a resin that has from about 2 to 45 mole percent of total repeat units with hydroxy (particularly alcohol, especially primary and secondary alcohol) groups based on total repeat units of the resin, more preferably a resin that has from about 2 to 30 mole percent of total repeat units with hydroxy (particularly alcohol, especially primary and secondary alcohol) groups based on total repeat units of the resin, still more preferably a resin that has from about 2 or 5 to 15, 20 or 25 mole percent of total repeat units with hydroxy (particularly alcohol, especially primary and secondary alcohol) groups based on total repeat units of the resin. While hydroxy groups (particularly primary and secondary alcohols) are effective groups to accomplish desired crosslinking, other lithographic properties can be compromised if excessive amounts of hydroxy functionality are present in a resist.

We also have found that carboxylate (—COOH) functionality present in a resist component particularly a resin can provide enhanced dissolution characteristics for the resist. Preferably however such carboxylate is limited, e.g. preferred resists contain a resin that has from about 0 to 25 mole percent of total repeat units with carboxylate (—COOH) groups based on total repeat units of the resin, more preferably a resin that has from about 0, 2 or 5 to about 15 or 20 mole percent of total repeat units with carboxylate (—COOH) groups based on total repeat units of the resin.

Resins of resists of the invention may comprise a variety of units such as a carbon alicyclic group (i.e. the group has all carbon ring members) that is fused to the polymer backbone, i.e. the carbon alicyclic ring has at least two carbon ring members that comprise the polymer backbone. Preferred fused carbon alicyclic groups are provided by polymerization of cyclic olefin (endocyclic double bond) compounds such as optionally substituted norbornene groups.

Resins of resists of the invention also may suitably contain an oxygen- and/or sulfur-containing heteroalicyclic ring that is preferably fused to the polymer backbone (i.e. at least two heteroalicyclic ring atoms as part of the polymer backbone). The heteroalicyclic ring has one or more oxygen and/or sulfur atoms as ring members.

Preferred resins of the invention also may contain resins that have repeat units that contain repeat units that contain one or more Si atoms. A variety of Si-resin systems may be employed such a polysiloxanes, polysilsesquioxanes, and the like. Generally preferred polymers of the invention include those that contain Si atoms as a component of the polymer backbone, e.g. Si—O linkages, rather than a polymer that does not contain Si atoms as part of the backbone or substantial part thereof, but rather as pendant groups. More particularly, preferred polymers include those where at least 5 percent of the total number of atoms in the polymer backbone are Si atoms, or where at least about 10, 15, 20, 25, 30, 35, 40, 45, or 50 percent of the total number of atoms in the polymer backbone are Si atoms. The Si polymer should have groups for crosslinking as discussed herein.

Photoresists of the invention that contain one or more such Si resins are preferably employed in multilayer lithography systems. More particularly, preferred uses of resists of the invention include application of a first organic polymer coating on a substrate, e.g. a semiconductor microelectronic wafer, and applying thereover a photoresist of the invention. The organic bottom layer suitably may be non-photoimageable (e.g. not contain a photoacid generator compound) but is thermally crosslinked prior to application of the resist layer. The bottom layer may comprise a phenolic polymer such as a novolac admixed with a thermal acid generator compound and a crosslinker. Use of such a bottom layer can enable application of a very thin top resist layer.

The above-discussed groups such as fluorinated alcohols including 1,1,1,3,3,3-hexafluoro-2-propanol groups, sulfonamides, primary and secondary alcohols that can crosslink, secondary and tertiary alcohols that can eliminate to provide a "solubility switch", can be substituents of any of such carbon alicyclic units, heteroalicyclic units, repeat units with an Si group, or acrylate units, or other repeat units of a resin.

Polymers of the invention also may contain units in addition to the above groups. For example, polymers of the invention also may contain nitrile units such as provided by polymerization of methacrylonitrile and acrylonitrile. Additional contrast enhancing groups also may be present in polymers of the invention, such as groups provided by polymermization of methacrylic acid, acrylic acid, and such acids protected as photoacid labile esters, e.g. as provided by reaction of ethoxyethyl methacrylate, t-butoxy methacrylate, t-butylmethacrylate and the like.

Generally preferred resins for use in resists of the invention contain 2, 3, 4 or 5 distinct repeat units, i.e. preferred are copolymers, terpolymers, tetrapolymers and pentapolymers.

Resins are preferably employed in photoresists imaged at sub-200 nm wavelengths such as 193 nm or 157 nm, and thus preferably will be substantially free of any phenyl or other aromatic groups. For example, preferred polymers contain less than about 5 mole percent aromatic groups, more preferably less than about 1 or 2 mole percent aromatic groups, more preferably less than about 0.1, 0.02, 0.04 and 0.08 mole percent aromatic groups and still more preferably less than about 0.01 mole percent aromatic groups. Particularly preferred polymers are completely free of aromatic groups. Aromatic groups can be highly absorbing of sub-200 nm radiation and thus are undesirable for polymers used in photoresists imaged with such short wavelength radiation.

The invention also provides the described resins.

The invention also includes methods for forming relief images, including methods for forming a highly resolved relief image such as a pattern of lines where each line has essentially vertical sidewalls and a line width of about 0.40 microns or less, and even a width of about 0.25, 0.20, 0.16 or 0.1 microns or less. The invention further provides articles of manufacture comprising substrates such as a microelectronic wafer substrate or liquid crystal display or other flat panel display substrate having coated thereon a polymer, photoresist or resist relief image of the invention. The invention also includes methods to manufacture such articles using a photoresist of the invention. Other aspects of the invention are disclosed infra.

DETAILED DESCRIPTION OF THE INVENTION

Figure 1:
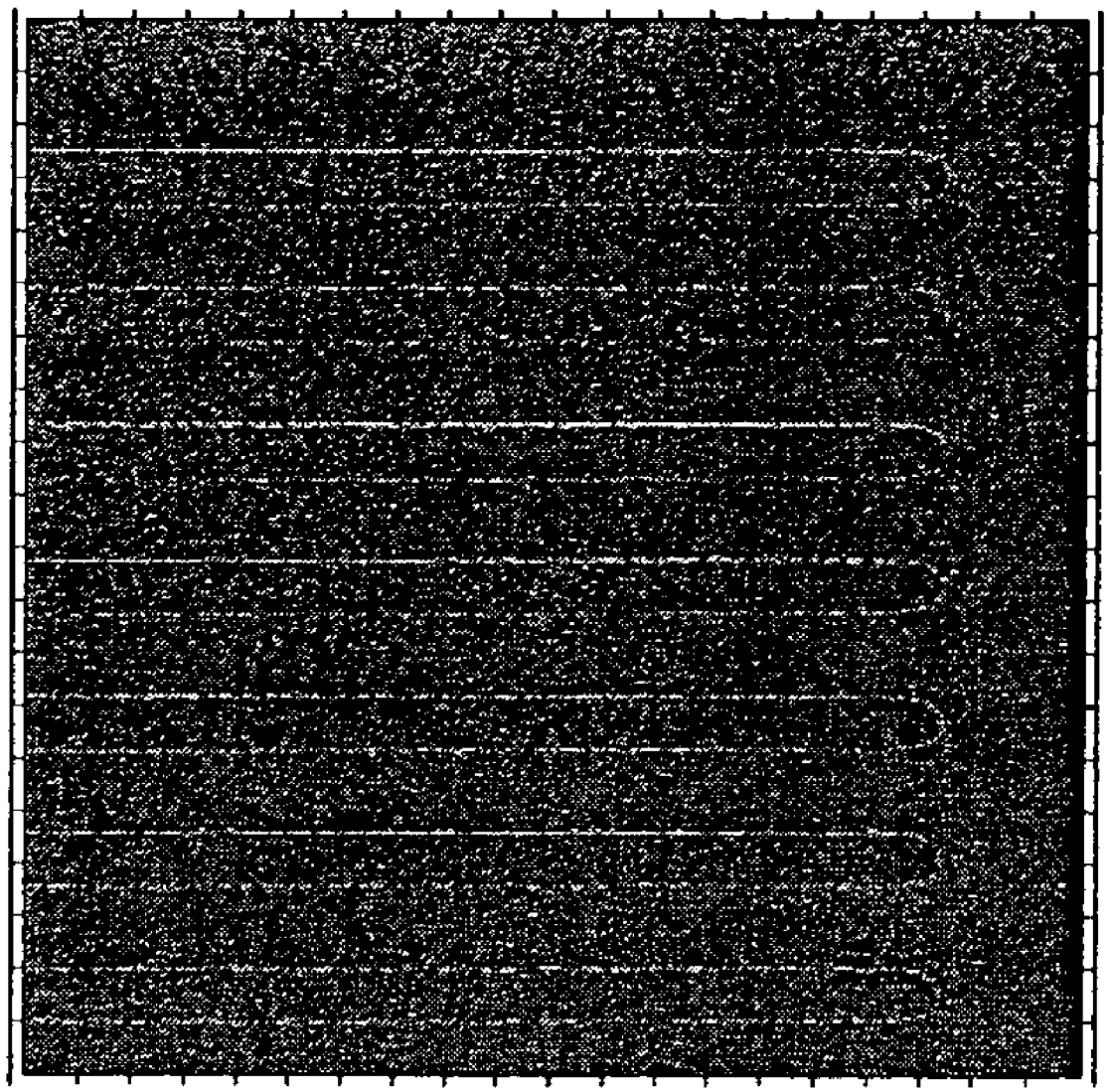
FIGS. 1 and 2 show relief images of photoresists of the invention.

As discussed above, negative-acting photoresists are now provided that can be effectively imaged with sub-200 nm wavelength radiation.

Particularly preferred resists of the invention may contain polymerized carbon alicyclic groups, such as polymerized optionally substituted norborne groups.

Additionally, it may be preferred to have a polymerized carbon alicyclic compounds such as optionally substituted norbornene as a repeat unit of a resin used in a resist of the invention. As referred to herein, the term "carbon alicyclic group" means each ring member of the non-aromatic group is carbon. The carbon alicyclic group can have one or more endocyclic carbon-carbon double bonds, provided the ring is not aromatic.

A particularly preferred reagent for synthesis of a resin for use in a resist of the invention is 1,1,1,3,3,3-hexafluoropropan-2-ol-nobornylene.

More particularly, preferred resins of the invention may comprise repeat units of the structures shown in the following Formulae I:

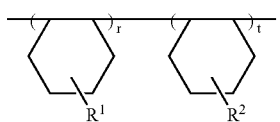

wherein in Formula I, $R^1$ and $R^2$ may be the same or different and are hydrogen or a non-hydrogen substituent such as a moiety containing an alcohol including primary or secondary alcohol e.g. a hydroxy$C_{1-10}$alkyl preferably hydroxy$C_{1-8}$alkyl which may be substituted by fluorine or other group; a moiety containing a carboxylate group such as $C_{1-10}$alkyl substituted by at least one —COOH group or a carboxy group that is bloked with an alkyl (i.e. ester) or substituted alkyl such as alcohol having from 1 to about 8 carbons; or an alkyl group such as $C_{1-10}$alkyl that is substituted by a group other than hydroxy or —COOH, such as fluoro or other halogen, alkoxy and the like, where preferably at least one or both of $R^1$ and $R^2$ are other than hydrogen; and r and t are each greater than zero.

Particularly preferred resins that contain fused carbocyclic alicyclic groups may comprise repeat units of the following formulae II or III:

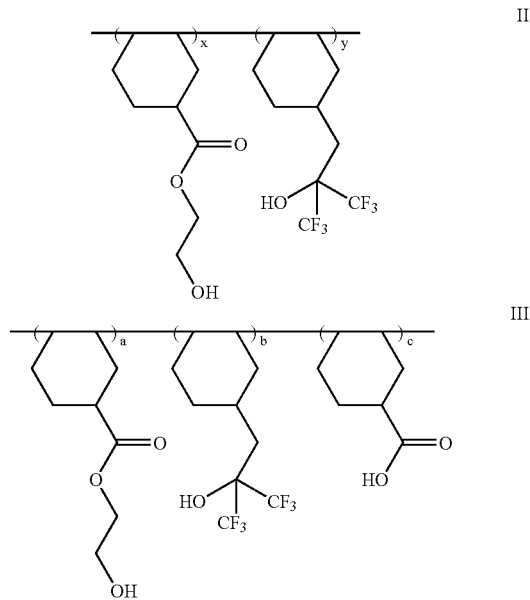

wherein in Formula II x and y are each greater than zero, and preferably x is from about 1 to about 20 mole percent based on total repeat units of the polymer, more preferably about 1 to about 12 or 15 mole percent based on total repeat units of the polymer; and y is from 1 to about 25 mole percent based on total repeat units of the polymer, more preferably from about 2 or 5 to about 12 or 15 mole percent based on total units of the polymer, and wherein in Formula III, a, b and c are each greater than zero, and preferably a is from 1 to about 20 mole percent base don total polymer units, and more preferably a is from 2 to about 15 mole percent based on total polymer units; b is from 1 to about 85 mole percent based on total units of the polymer, more preferably b is from 2 to about 75 or 80 mole percent of total polymer units, still more preferably b is from 5 or 10 to about 75 or 80 mole percent of total polymer units.

As discussed above, resins used in resists of the invention also may contain a heteroalicyclic ring that is preferably fused to a polymer backbone. The fused heterocyclic ring units contain one or more oxygen and/or sulfur atoms. By stating herein that a cyclic group is fused to a polymer backbone, it is meant that two ring members of the cyclic group, typically two adjacent carbon atoms of the cyclic group, are also part of the polymer backbone. Such a fused ring can be provided by polymerizing a cyclic monomer that has an endocyclic double bond.

The oxygen and/or sulfur atoms of the heteroalicyclic ring are preferably direct ring members (bi-radical linkages), rather than e.g. a multiple bond group such as a keto or thioketo ring member. Also, less preferred are groups that contain any such saturated groups such as a ketone or other carbonyl including ester, lactone, anhydride, etc.

Preferred oxygen ring polymer units will be free of other hetero atoms such as sulfur (i.e. only oxygen and carbon ring members). Typically, the oxygen ring unit will contain a single oxygen ring atom and may have one or more ring substituents. As discussed above, it has been found that such ring substituents can significantly enhance substrate adhesion.

Polymers of the invention also may contain additional units such as cyano units, lactone units or anhydride units. For example, acrylonitrile or methacrylonitrile may be polymerized to provide pendant cyano groups, or maleic anhydride may be polymerized to provide a fused anhydride unit.

Acrylate repeat units are particularly preferred in resins used in resists of the invention. 4-hydroxyadamantylmethacrylate is a particularly preferred reagent to use the synthesis of a resin employed in a resist of the invention. As referred to herein, the term "acrylate" is inclusive of substituted acrylates such as e.g. methacrylates.

As also discussed above, preferred resins for use in the invention include repeat units with Si atoms. Suitable Si polymers for use in resists of the invention include those that are formed from polymerization of a silyl halide or silyl alkoxide, particularly a silyl trihalide or trialkoxy silane such as reagent of the formula R—Si(halide)$_3$ e.g. R—Si(Cl)$_3$. The R moiety suitably is preferably an optionally substituted alkyl or alicyclic groups such as norbornyl, adamantyl or the like. Such R groups may be substituted by an aqueous base-solubilizing groups such as a fluorinated alcohol, sulfonamide, thiol, or the like.

Also preferred are Si polymers that contain two or three or more distinct repeat units. Such copolymers and higher order polymers may be readily prepared. For instance, a hydroxy-Si reagent can be polymerized such as a hydroxylalkyl silyl reagent. A formed hydroxy-Si polymer can be functionalized to provide multiple distinct repeat units, e.g. pendant groups such as provided by reaction of a sulfonyl acid or acid chloride or the like. Preferably, those distinct groups are reacted sequentially with the pre-formed hydroxy Si polymer, although it is possible to make both additions to the pre-formed polymer in a single reaction sequence. Preferably, a portion of the hydroxy moieties are left unreacted (i.e. unsubstituted) to provide aqueous, alkaline developing enhancing OH groups.

As mentioned above, preferred Si-polymers for use in a negative-acting resist compositions of the invention will contain primary and secondary hydroxy moieties, suitably primary or second alcohol groups that may be present as hydroxyC$_{1-20}$alkyl groups. Such primary and secondary hydroxy can be effective sites or moieties for crosslinking.

A preferred synthesis of an Si polymer useful in resists of the invention is set forth in the examples which follow.

As discussed above, polymers of the invention are preferably employed in photoresists imaged at short wavelengths, particularly sub-200 nm such as 193 nm and 157 nm. Polymers also can be employed in photoresists imaged at higher wavelengths such as 248 nm. For such higher wavelength applications, the polymer may suitably contain aromatic units, e.g. polymerized styrene or hydrostyrene units.

As discussed, various moieties may be optionally substituted, including groups of the described resins. A "substituted" substituent may be substituted at one or more available positions, typically 1, 2, or 3 positions by one or more suitable groups such as e.g. halogen (particularly F, Cl or Br); cyano; C$_{1-8}$ alkyl; C$_{1-8}$ alkoxy; C$_{1-8}$ alkylthio; C$_{1-8}$ alkylsulfonyl; C$_{2-8}$ alkenyl; C$_{2-8}$ alkynyl; hydroxyl; nitro; alkanoyl such as a C$_{1-6}$ alkanoyl e.g. acyl and the like; etc.

Polymers of the invention can be prepared by a variety of methods. In addition to the methods of preparation of Si polymers as discussed above, synthesis of other polymers (non-Si polymers such as involving cyclic olefins) include addition reactions which may include free radical polymerization, e.g., by reaction of selected monomers to provide the various units as discussed above in the presence of a radical initiator under an inert atmosphere (e.g., N$_2$ or argon) and at elevated temperatures such as about 70° C. or greater, although reaction temperatures may vary depending on the reactivity of the particular reagents employed and the boiling point of the reaction solvent (if a solvent is employed). Suitable reaction solvents include e.g. tetrahydrofuran, ethyl lactate and the like. Suitable reaction temperatures for any particular system can be readily determined empirically by those skilled in the art based on the present disclosure. A variety of free radical initiators may be employed. For example, azo compounds may be employed such as azobis-2,4-dimethylpentarienitrile. Peroxides, peresters, peracids and persul fates also could be employed. Suitable syntheses are exemplified in the examples which follow.

Other monomers that can be reacted to provide a polymer of the invention can be identified by those skilled in the art. As mentioned above, maleic anhydride is a preferred reagent to provide fused anhydride polymer units. Itaconic anhydride also is a preferred reagent to provide anhydride polymer units, preferably where the itaconic anhydride has purified such as by extraction with chloroform prior to polymerization. Vinyl lactones are also preferred reagents, such as alpha- and gamma-butyrolactone.

For synthesis of polymers disclosed herein that comprise polymerized cyclic olefin groups such as optionally substituted carbon alicyclic norbornyl (including polymers of any of Formulae I through III above), a metal-catalyzed reaction using e.g. Ni or Pd catalysts can be employed. Such synthetic methods are disclosed e.g. in U.S. Pat. No. 6,303,724.

For additional polymers that include ethylene as a monomer using such catalysts, methods are disclosed in U.S. Pat. No. 6,265,506.

Polymers useful in photoresists of the invention also are commercially available, e.g. from vendors such as Promerus, LLC (United States).

Preferably a polymer of the invention will have a weight average molecular weight (Mw) of about 800 or 1,000 to about 100,000, more preferably about 2,000 to about 30,000, still more preferably from about 2,000 to 15,000 or 20,000, with a molecular weight distribution (Mw/Mn) of about 3 or less, more preferably a molecular weight distribution of about 2 or less. Molecular weights (either Mw or Mn) of the polymers of the invention are suitably determined by gel permeation chromatography.

As discussed above, polymers of the invention are highly useful as a resin component in photoresist compositions, particularly negative resists. Photoresists of the invention in general comprise a photoactive component and a resin component as described above.

The resin component generally should be used in an amount sufficient to render a coating layer of the resist developable with an aqueous alkaline developer.

The resist compositions of the invention also comprise a photoacid generator (i.e. "PAG") that is suitably employed in an amount sufficient to generate a latent image in a coating layer of the resist upon exposure to activating radiation. Preferred PAGs for imaging at 193 nm and 248 nm imaging include imidosulfonates such as compounds of the following formula:

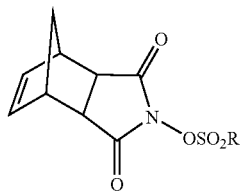

wherein R is camphor, adamantane, alkyl (e.g. $C_{1-12}$ alkyl) and perfluoroalkyl such as perfluoro($C_{1-12}$alkyl), particularly perfluorooctanesulfonate, perfluorononanesulfonate and the like. A specifically preferred PAG is N-[(perfluorooctanesulfonyl)oxy]-5-norbornene-2,3-dicarboximide.

Sulfonate compounds are also suitable PAGs, particularly sulfonate salts. Two suitable agents for 193 nm and 248 nm imaging are the following PAGS 1 and 2:

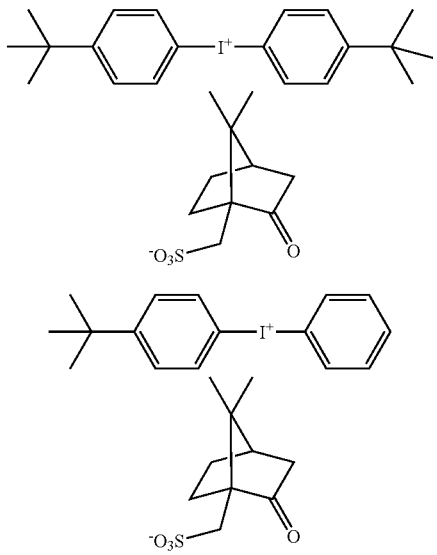

Such sulfonate compounds can be prepared as disclosed in European Patent Application 96118111.2 (publication number 0783136), which details the synthesis of above PAG 1.

Also suitable are the above two iodonium compounds complexed with anions other than the above-depicted camphorsulfonate groups. In particular, preferred anions include those of the formula $RSO_3$— where R is adamantane, alkyl (e.g. $C_{1-12}$ alkyl) and perfluoroalkyl such as perfluoro ($C_{1-12}$alkyl), particularly perfluorooctanesulfonate, perfluorobutanesulfonate and the like.

Other known PAGS also may be employed in the resists of the invention.

As discussed above, at least some resists of the invention will contain a crosslinker component.

A variety of organic materials may be employed as a crosslinker. More preferred are non-aromatic crosslinkers that may be e.g. monomers or polymers and that a combination of different compounds may be employed.

Suitable organic cross-linking agents useful in the present invention include, but are not limited to: amine containing compounds, epoxy containing materials, compounds containing at least two vinyl ether groups, and combinations thereof. Preferred cross-linking agents include amine containing compounds and epoxy containing materials.

The amine containing compounds useful as cross-linking agents in the present invention include, but are not limited to: a melamine monomers, melamine polymers, alkylolmethyl melamines, benzoguanamine resins, benzoguanamine-formaldehyde resins, urea-formaldehyde resins, glycoluril-formaldehyde resins, and combinations thereof. These resins may be prepared by the reaction of acrylamide or methacrylamide copolymers with formaldehyde in an alcohol-containing solution, or alternatively by the copolymerization of N-alkoxymethylacrylamide or methacrylamide with other suitable monomers. Particularly suitable amine-based crosslinkers include the melamines manufactured by Cytec of West Paterson, N.J., such as CYMEL™ 300, 301, 303, 350, 370, 380, 1116 and 1130; benzoguanamine resins such as CYMEL™ 1123 and 1125; the glycoluril resins CYMEL™ 1170, 1171 and 1172; and the urea-based resins BEETLE™ 60, 65 and 80, also available from Cytec, West Paterson, N.J. A large number of similar amine-based compounds are commercially available from various suppliers.

Melamines are often preferred amine-based cross-linkers. Particularly preferred are alkylolmethyl melamine resins. These resins are typically ethers such as trialkylolmethyl melamine and hexaalkylolmethyl melamine. The alkyl group may have from 1 to 8 or more carbon atoms but is preferably methyl and propyl. Depending upon the reaction conditions and the concentration of formaldehyde, the methyl ethers may react with each other to form more complex units.

Particularly suitable amine-based cross-linking agents include those of formula IV

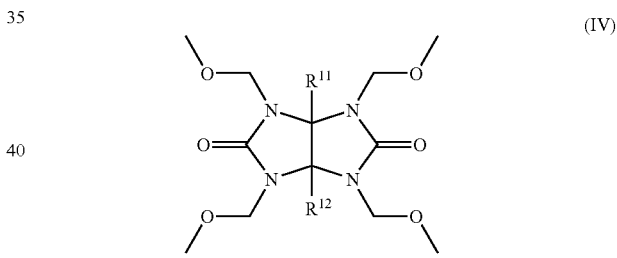

wherein $R^{11}$ and $R^{12}$ are independently selected from H, $(C_1-C_6)$alkyl and phenyl. Preferred alkyl groups for $R^{11}$ and $R^{12}$ are methyl and propyl.

Epoxy containing materials useful as cross-linkers in the present invention are any organic compounds having one or more oxirane rings that are polymerizable by ring opening. Such materials, broadly called epoxides, include, but are not limited to: monomeric epoxy compounds, and polymeric epoxides that may be aliphatic, cycloaliphatic, aromatic or heterocyclic. Preferred epoxy cross-linking materials generally, on average, have at least 2 polymerizable epoxy groups per molecule. The polymeric epoxides include linear polymers having terminal epoxy groups (e.g., diglycidyl ether of a polyoxyalkylene glycol), polymers having skeletal oxirane units (e.g., polybutadiene polyepoxide), and polymers having pendant epoxy groups (e.g., glycidyl methacrylate polymer of copolymer). The epoxides may be pure compounds but are generally mixtures containing one, two or more epoxy groups per molecule.

Useful epoxy-containing materials may vary from low molecular weight monomeric materials and oligomers to relatively high molecular weight polymers and may vary greatly in the nature of their backbone and substituent groups. For example, the backbone may be of any type and substituent groups may be any group free of any substituents reactive with an oxirane ring at room temperature. Suitable substituents include, but are not limited to: halogens, ester groups, ethers, sulfonate groups, siloxane groups, nitro groups, phosphate groups, and the like.

Particularly useful epoxy containing materials in the present invention include glycidyl ethers. Examples are the glycidyl ethers of polyhydric phenols obtained by reacting a polyhydric phenol with an excess of chlorohydrin such as epichlorohydrin (e.g., the diglycidyl ether of 2,2-bis-(2,3-epoxypropoxyphenol)propane). Such glycidyl ethers include bisphenol A epoxies, such as bisphenol A ethoxylated diepoxide. Further examples of epoxies of this type are described in U.S. Pat. No. 3,018,262, herein incorporated herein by reference to the extent this patent teaches the preparation of such epoxies.

Suitable epoxides useful in the present invention include, but are not limited to: epichlorohydrin, glycidol, glycidylmethacrylate, the glycidyl ether of p-tertiarybutylphenol (e.g., those available under the trade name EPI-REZ 5014 from Celanese); diglycidyl ether of Bisphenol A (e.g., those available under the trade designations EPON 828, EPON 1004 and EPON 1010 from Shell Chemical Co.; and DER-331, DER-332 and DER-334 from Dow Chemical Co.), vinylcyclohexene dioxide (e.g., ERL-4206 from Union Carbide Corp.), 3,4-epoxy-6-methyl-cyclohexylmethyl-3,4-epoxy-6-methylcyclohexene carboxylate (e.g., ERL-4201 from Union Carbide Corp.), bis(3,4-epoxy-6-methylcyclohexylmethyl)adipate (e.g., ERL-4289 from Union Carbide Corp.), bis(2,3-epoxycyclopentyl)ether (e.g., ERL-0400 from Union Carbide Corp.), aliphatic epoxy modified with polypropylene glycol (e.g., ERL-4050 and ERL-4269 from Union Carbide Corp.), dipentene dioxide (e.g., ERL-4269 from Union Carbide Corp.), flame retardant epoxy resins (e.g., DER-580, a brominated bisphenol type epoxy resin available from Dow Chemical Co.), 1,4-butanediol diglycidyl ether of phenolformaldehyde novolak (e.g., DEN-431 and DEN-438 from Dow Chemical Co.), and resorcinol diglycidyl ether (e.g., KOPOXITE from Koppers Company, Inc.).

Compounds containing at least two vinyl ether groups include, but are not limited to divinyl ethers of aliphatic, cycloaliphatic, aromatic or araliphatic diols. Examples of such materials include divinyl ethers of aliphatic diols having from 1 to 12 carbon atoms, polyethylene glycols, propylene glycols, polybutylene glycols, dimethylcyclohexanes, and the like. Particularly useful compounds having at least two vinyl ether groups include divinyl ethers of ethylene glycol, trimethylene-1,3-diol, diethylene glycol, triethylene glycol, dipropylene glycol, tripropylene glycol, resorcinol, Bisphenol A, and the like.

Particularly suitable organic cross-linking agents include those containing one o more methoxymethyl groups, such as methoxymethyl-substituted melamines and methoxymethyl-substituted glycourils such as those of formula IV, above. Hexamethoxymethylmelamine is a preferred methoxymethyl-substituted melamine. It is further preferred that one or more of the hydrogens of the organic cross-linking agent, and more preferably one or more of the methyl hydrogens in the methoxymethyl substituent, is substituted with a halogen, preferably fluorine. Thus, preferred cross-linkers include those containing one or more methoxyfluoromethyl and/or methoxydifluoromethyl substituents. Exemplary preferred fluorinated cross-linking agents include methoxyfluoromethyl- and methoxydifluoromethyl-substituted melamines and glycourils, such as hexamethoxyfluoromethylmelamine and hexamethoxydifluoromethylmelamine. Also suitable are fluorinated epoxy cross-linking agents. For certain applications, it is preferred that the cross-linking agent is fluorinated.

The compositions of the present invention may suitably comprise only a single type of organic cross-linker, e.g., only an amine containing cross-linker, or may contain two or more different cross-linkers. When a combination of organic cross-linkers is used in the present invention, it is preferred that the combination include an amine containing compound and an epoxy containing compound. The concentration of organic cross-linking agents in the compositions of the present invention may vary within a relatively wide range. It will be appreciated by those skilled in the art that suitable organic cross-linker concentrations will vary with factors such as cross-linker reactivity and specific application of the composition. Typically, the cross-linking agent(s) is present in an amount in the range of 0.1 to 80% by weight, based on the total weight of the composition, preferably in the range of 0.5 to 50%, and more preferably in the range of 1 to 25%.

A preferred optional additive of resists of the invention is an added base, particularly Troger's base, tetrabutylammonium hydroxide (TBAH), or tetrabutylammonium lactate, which can enhance resolution of a developed resist relief image. For resists imaged at 193 nm, a preferred added base is a hindered amine such as diazabicyclo undecene or diazabicyclononene. The added base is suitably used in relatively small amounts, e.g. about 0.03 to 5 percent by weight relative to the total solids.

Photoresists of the invention also may contain other optional materials. For example, other optional additives include anti-striation agents, plasticizers, speed enhancers, etc. Such optional additives typically will be present in minor concentrations in a photoresist composition except for fillers and dyes which may be present in relatively large concentrations, e.g., in amounts of from about 5 to 30 percent by weight of the total weight of a resist's dry components.

The resists of the invention can be readily prepared by those skilled in the art. For example, a photoresist composition of the invention can be prepared by dissolving the components of the photoresist in a suitable solvent such as, for example, cyclohexanone, ethyl lactate, ethylene glycol monomethyl ether, ethylene glycol monomethyl ether acetate, propylene glycol monomethyl ether; propylene glycol monomethyl ether acetate and 3-ethoxyethyl propionate. Typically, the solids content of the composition varies between about 5 and 35 percent by weight of the total weight of the photoresist composition. The resin binder and photoactive components should be present in amounts sufficient to provide a film coating layer and formation of good quality latent and relief images. See the examples which follow for exemplary preferred amounts of resist components.

The compositions of the invention are used in accordance with generally known procedures. The liquid coating compositions of the invention are applied to a substrate such as by spinning, dipping, roller coating or other conventional coating technique. When spin coating, the solids content of the coating solution can be adjusted to provide a desired film thickness based upon the specific spinning equipment utilized, the viscosity of the solution, the speed of the spinner and the amount of time allowed for spinning.

As discussed above, the resists of the invention that contain an Si-polymer are particularly suitable for use as a top layer in a bilayer photoresist system. As also discussed above, in such a system, a bottom layer of a conventional photoresist, such as novolac polymer based resist, inert polyarylether-sulfone copolymer based resist or a novolac or polyhydroxystyrene-based thermally cross-linkable system. Such bottom layer is typically applied to or coated on a substrate using any of the above described procedures. The bottom layer is then hard baked such as at 230° C. for 2 minutes, after which the present photoimageable compositions are coated on the cured bottom layer. The bottom layers preferably contain an amount of a UV absorbing component, such as an anthracene dye, sufficient for optical density and etch performance. The bottom layers typically have a thickness of from 0.4 to 1 µm. The top layer of the present photoimageable compositions is typically from 0.05 to 1 µm thick, preferably from 0.05 to 0.5 µm, and more preferably from 0.05 to 0.3 µm.

The present photoimageable compositions are useful in all applications where photoresists are typically used. For example, the compositions may be applied over silicon wafers or silicon wafers coated with silicon dioxide for the production of microprocessors and other integrated circuit components. As discussed, for many applications, the resist would be used as a bilayer system and disposed over an organic underlayer composition. Aluminum-aluminum oxide, gallium arsenide, ceramic, quartz, copper, glass, spin-on organic dielectrics, spin-on or chemical vapor deposited inorganic dielectrics, and the like are also suitable employed as substrates for the photoresist compositions of the invention. Other chemical vapor deposited layers, such as cap layers, etch stops and the like, may also be used as substrates.

The present resist compositions may also be used in optoelectronics applications, such as in the manufacture of optical waveguides, optical interconnects and the like. By "optical waveguide" is meant any device that transmits optical radiation across a two-dimensional substrate surface. Suitable optical waveguides include, but are not limited to, splitters, couplers, spectral filters, polarizers, isolators, wavelength division multiplexing structures, and the like. Such waveguides may also contain active functionality, such as amplification and switching such as with electro-optic, thermo-optic or acousto-optic devices. To be useful as amplifiers, the present waveguides typically contain one or more dopants. Erbium is an exemplary dopant. Such dopants are well known in the art. Thus, the present waveguides suitable for use as amplifiers contain one or more dopants.

The waveguides of the present invention may be manufactured as individual waveguides or as an array of waveguides. Whether such waveguides are prepared as an array depends on the particular use and is within the ability of one skilled in the art. Use of resists of the invention for waveguide applications and manufacture is suitably by procedures disclosed in WO 02/091083 to Gronbeck et al.

In one embodiment, for manufacture of an integrated circuit, a layer of the present compositions is disposed on a wafer substrate (e.g. having a diameter of less than 20 or 10 inches) by spin coating or other application.

Following coating of the photoresist onto a surface, it is dried by heating to remove the solvent until preferably the photoresist coating is tack free. Thereafter, it is imaged through a mask in conventional manner. The exposure is sufficient to effectively activate the photoactive component of the photoresist system to produce a patterned image in the resist coating layer and, more specifically, the exposure energy typically ranges from about 1 to 100 mJ/cm$^2$, dependent upon the exposure tool and the components of the photoresist composition.

As discussed above, coating layers of the resist compositions of the invention are preferably photoactivated by a short exposure wavelength, particularly a sub-300 and sub-200 nm exposure wavelength. As discussed above, 193 nm is a particularly preferred exposure wavelength. 157 nm also is a preferred exposure wavelength. However, the resist compositions of the invention also may be suitably imaged at higher wavelengths.

Following exposure, the film layer of the composition is preferably baked at temperatures ranging from about 70° C. to about 160° C. Thereafter, the film is developed. The exposed resist film is negative-working by employing a polar developer, preferably an aqueous based developer such as quaternary ammonium hydroxide solutions such as a tetra-alkyl ammonium hydroxide solution; various amine solutions preferably a 0.26 N tetramethylammonium hydroxide, such as ethyl amine, n-propyl amine, diethyl amine, di-n-propyl amine, triethyl amine, or methyldiethyl amine; alcohol amines such as diethanol amine or triethanol amine; cyclic amines such as pyrrole, pyridine, etc. In general, development is in accordance with procedures recognized in the art.

Following development of the photoresist coating over the substrate, the developed substrate may be selectively processed on those areas bared of resist, for example by chemically etching or plating substrate areas bared of resist in accordance with procedures known in the art. For the manufacture of microelectronic substrates, e.g., the manufacture of silicon dioxide wafers, suitable etchants include a gas etchant, e.g. a halogen plasma etchant such as a chlorine or fluorine-based etchant such a $Cl_2$ or $CF_4/CHF_3$ etchant applied as a plasma stream. After such processing, resist may be removed from the processed substrate using known stripping procedures.

All documents mentioned herein are incorporated herein by reference. The following non-limiting examples are illustrative of the invention.

EXAMPLES 1–3

Polymer Syntheses

EXAMPLE 1

Synthesis of 1,1,1,3,3,3-hexafluoropropan-2-ol-norbornylene-co-maleic anhydride

The polymer was prepared by adding equimolar quantities of 1,1,1,3,3,3-hexafluoropropan-2-ol-norbornylene (29.05 g) and maleic anhydride (10.96 g) and dissolving in tetrahydrofuran to produce a 50 weight percent monomer solution. 1.03 g dimethylazodiisobutyrate was dissolved in tetrahydrofuran to make a 50 weight percent initiator solution. Each solution was degassed for one half hour by bubbling nitrogen through each. The monomer solution was heated under a nitrogen blanket. At 65° C., the degassed initiator solution was injected into the monomer solution. The combined reaction solution was heated to reflux, and held at reflux for 4 hours, after which the reaction vessel was submerged in an ice water bath to cool to room temperature. Upon cooling, the reaction mixture was precipitated into 1 L heptane, stirred for 15 minutes and then filtered. The polymer was then allowed to dry overnight under nitrogen. The wet polymer was then dissolved in tetrahydrofuran to make a 50 weight percent solution which was reprecipitated into 1 L heptane, stirred for 15 minutes and then filtered. The resulting precipitate was then washed with 0.2 L heptane, and then filtered. The precipitated polymer was then dried for 24 hours at 50° C. in a vacuum oven.

EXAMPLE 2

Synthesis of 4-hydroxyadamantylmethacrylate-co-1,1,1,3,3,3-hexafluoropropan-2-ol-norbornylene-co-maleic anhydride The polymer was prepared by adding quantities in the molar rations of 1:2:2, respectively, of hydroxyadamantylmethacyralte (9.93 g), hexafluoropropanolnorbornylene (21.85 g) and maleic anhydride (8.23 g) and dissolving in tetrahydrofuran to make a 50 weight percent monomer solution. 1.00 g dimethyl azodiisobutyrate was dissolved in tetrahydrofuran to make a 50 weight percent initiator solution. Each solution was degassed for one half hour by bubbling nitrogen through each. The monomer solution was heated under a nitrogen blanket. At 65° C., the degassed initiator solution was injected into the monomer solution. The combined reaction solution was heated to reflux, and held at reflux for 4 hours, after which the reaction vessel was submerged in an ice water bath to cool to room temperature. Upon cooling, the reaction mixture was precipitated into 1 L heptane, stirred for 15 minutes, then filtered. The precipitated polymer was then washed with an additional 0.2 L heptane then filtered. The polymer was then allowed to dry overnight under nitrogen. The wet polymer was then dissolved in tetrahydrofuran to make a 50 weight percent solution which was reprecipitated into 1 L heptane, stirred for 15 minutes, then filtered. The precipitated polymer was then dried for 24 hours at 50° C. in a vacuum oven.

EXAMPLE 3

Si Polymer Synthesis

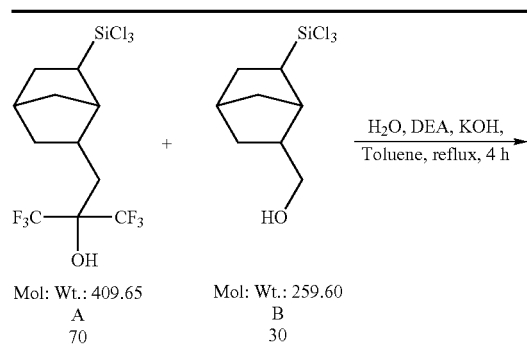

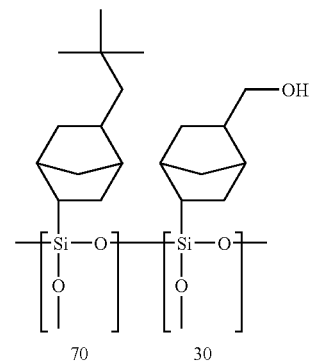

| Charge: | |
|---|---|
| A: | 14.33 g (0.035 mol) |
| B: | 3.89 g (0.015 mol) |
| Toluene: | 45 ml |
| Acetone: | 20 ml |
| Deionized Water: | 16.8 g |
| Diethylamine: | 10.9 g |
| KOH: | 0.42 g in 3 ml water |

To a 250 ml 3 necked round bottmed flask fitted with a thermometer and an addition funnel was added the solution of DEA (11 g), DI water (16.8 g), toluene (10 ml) and acetone (20 ml). The flask temperature was maintained between 0 to −5° C. To this chill solution was added a mixture of the monomers (A and B) and toluene (30 ml) drop wise over a period of 55 min. (Note: at 0° C., there were two phases: a milky white bottom layer and a clear toluene top layer). After the addition was complete the whole mixture was allowed to come to room temperature and stirred for additional 1.5 hr. The two layers were separated by addition of extra water to dissolve the quaternary ammonium salt (Observation: apart from the two layers, an oily white material was found in the flask which was not soluble in water as well as in toluene at room temperature. However the oily materials dissolved completely in toluene when it was heated to 50° C. The toluene layer was washed with DI water (3×1500 ml). The pH was still around 9. It was further washed with 10% acetic acid (1×50 ml) and further washed with DI water to bring the pH to 7.

The toluene layer from above work-up was added into a 250 ml 3 necked RB flask (total solution was ~200 ml) fitted with a thermometer, Dean-Stark trap and a condenser. To the total solution was added 0.42 g of KOH dissolved in 2 ml DI water followed by 1.0 ml of DI water rinse. The mixture was heated to reflux to azeotrope water that was added to the reaction and formed during condensation. The reflux was continued for 4 h. After 4 h reflux, the solution was brought into room temperature and washed with 20% acetic acid (2×50 ml) further with DI water until the pH=7. The toluene solution was washed with ion-exchange resin (IRN-150) for 2 hr. Filtered the resins and toluene was removed and the polymer was dried at 50° C. overnight. The final polymer was analyzed by various techniques such as: $^1$H, $^{13}$C & $^{29}$Si NMR, GPC-PDA, DSC, TGA, Base content, FT-IR, MALDI-TOF.

EXAMPLE 4

Photoresist Preparation and Processing

A negative-acting photoresist is prepared by admixing the following components in the specified amounts:
1) 2.53 g of the polymer of Example 1;
2) 0.228 g of photoacid generator of trifluoro-methansulfonic acid 3,5-dioxo-4-axa-tricyclo[5.2.1.02.6]dec-8-en-4-yl ester 3) 0.238 g of photoacid generator of 1,3,5,7-tetrakis-methoxymethyl-4-methyl-8-propyl-[1,3,5,7]tetrazocane-2,6-dione
4) 0.004 g of base additive of Troger's base
5) 0.002 g of perfluorinated surfactant of R-08 (3M)
6) 21.998 g of solvent of cyclohexanone The thus formed photoresist is lithographically processed as follows. The formulated resist composition is spin coated onto HMDS vapor primed 4 inch silicon wafers and soft-baked via a vacuum hotplate at 130° C. for 60 seconds. The resist coating layer is exposed through a photomask at 193 nm using an ISI microstepper, and then the exposed coating layers are post-exposure baked (PEB) at about 130° C. The coated wafers are then treated with 0.26N aqueous tetramethylammonium hydroxide solution to develop the negative-tone resist layer.

EXAMPLE 5

Further Resist Preparation and Processing

A negative-acting photoresist is prepared by admixing the following components in the specified amounts:
1) 2.469 g of the polymer of Example 2;
2) 0.295 g of photoacid generator of triphenyl sulfonium trifluoromethanesulfonate
3) 0.232 g of photoacid generator of 1,3,5,7-tetrakis-methoxymethyl-4-methyl-8-propyl-[1,3,5,7]tetrazocane-2,6-dione
4) 0.004 g of base additive of Troger's base
5) 0.002 g of perfluorinated surfactant of R-08 (3M)
6) 21.998 g of solvent of cyclohexanone The thus formed photoresist is lithographically processed as follows. The formulated resist composition is spin coated onto HMDS vapor primed 4 inch silicon wafers and soft-baked via a vacuum hotplate at 130° C. for 60 seconds. The resist coating layer is exposed through a photomask at 193 nm using an ISI microstepper, and then the exposed coating layers are post-exposure baked (PEB) at about 130° C. The coated wafers are then treated with 0.26N aqueous tetramethylammonium hydroxide solution to develop the negative-tone resist layer.

EXAMPLE 6

Bilayer Resist Preparation and Processing

A bilayer negative photoresist is prepared as follows. A resist solution is obtained by mixing 94.86 parts of the Si polymer prepared in Example 3, 4.50 parts of triphenylsulfonium perfluorobutanesulfonate, 0.54 parts of Troeger's base and 0.1 parts of a surfactant with 660 parts of 2-heptanone. The thus prepared resist formulation is applied by spin coating to a thickness of 1000±15 Å onto a phenolic underlayer composition layer. The applied photoresist coating layer is soft baked at 120° C. for 60 seconds. The underlayer composition layer is previously by spin coating onto an 8 inch silicon wafer to a thickness of 5100 Å using a 60 second bake at 250° C.

The applied resist layer was exposed to 193 nm radiation using an ISI Microstepper (0.60 NA, 0.70σ) through a binary photomask using conventional illumination. Wafers are subjected to a post-exposure bake at 250° C. for 60 seconds and subsequently developed in an 2.6 N aqueous alkaline using a 60 second single puddle process without pre-wetting. Developed resist relief images from such a process are shown in FIG. 1 of the Drawings.

EXAMPLE 7

Resist Preparation and Processing

A photoresist composition is prepared by admixing a polymer that consists of repeat units shown in Formula III above where x is 15 mole percent and y is 85 mole percent; a blend of photoacid generator of triphenylsulfonium perfluorobutanesulfonate and a pentamethylenesulfonium perfluoro-1-butanesulfonate., a crosslinker of the above Formula IV where $R^{11}$ is methyl and $R^{12}$ is propyl, Troger's base and a surfactant with ethyl lactate solvent.

Figure 2:
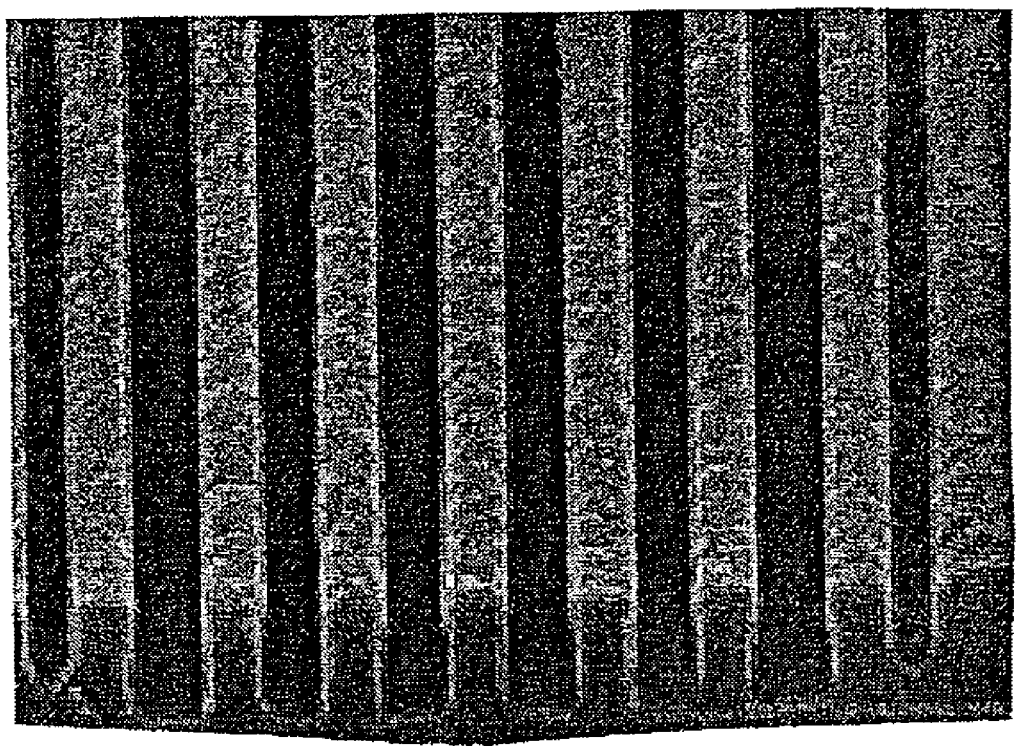

The prepared resist is lithorgraphically processed as described in Example 5 above. Developed resist relief images from such a process are shown in FIG. 2 of the Drawings.

The foregoing description of the invention is merely illustrative thereof, and it is understood that variations and modification can be made without departing from the spirit or scope of the invention as set forth in the following claims.

What is claimed is:

1. A method for providing a negative-tone photoresist relief image, comprising:
    a) applying on a substrate a coating layer of a negative-acting photoresist composition that comprises a photoactive component and a resin that is at least substantially free of aromatic groups and comprises one or more sulfonamide groups;
    b) exposing the photoresist coating layer to radiation having a wavelength of less than 200 nm; and
    c) developing the exposed coating layer with an aqueous alkaline composition to provide a negative tone photoresist image on the substrate.

2. The method of claim 1 wherein the photoresist coating layer is exposed with radiation having a wavelength of about 193 nm.

3. The method of claim 1 wherein the resin comprises units that comprise a fluorinated sulfonamide.

4. The method of claim 1 the resin comprises a fluorinated alcohol group.

5. The method of claim 1 wherein the resin comprises one or more secondary alcohol groups.

* * * * *